(12) United States Patent  
Mori et al.

(10) Patent No.: US 7,569,906 B2
(45) Date of Patent: Aug. 4, 2009

(54) METHOD FOR FABRICATING CONDENSER MICROPHONE AND CONDENSER MICROPHONE

(75) Inventors: Mitsuyoshi Mori, Kyoto (JP); Keisuke Tanaka, Osaka (JP); Takumi Yamaguchi, Kyoto (JP); Takuma Katayama, Kyoto (JP)

(73) Assignee: Panasonic Corporation, Osaka (JP)

( * ) Notice: Subject to any disclaimer, the term of this patent is extended or adjusted under 35 U.S.C. 154(b) by 337 days.

(21) Appl. No.: 11/702,531

(22) Filed: Feb. 6, 2007

(65) Prior Publication Data

US 2007/0272992 A1 Nov. 29, 2007

(30) Foreign Application Priority Data

Mar. 29, 2006 (JP) ............... 2006-092354

(51) Int. Cl.
*H01L 29/00* (2006.01)
*H01L 29/84* (2006.01)
(52) U.S. Cl. .................. 257/522; 257/723; 257/777; 257/416; 257/E23.013
(58) Field of Classification Search ................. 257/522, 257/723, 777, 416, E23.013; 381/174, 191
See application file for complete search history.

(56) References Cited

U.S. PATENT DOCUMENTS 5,573,679 A * 11/1996 Mitchell et al. ............... 216/2
6,232,140 B1 * 5/2001 Ferrari et al. ................. 438/50
6,667,189 B1 * 12/2003 Wang et al. ................... 438/53
7,329,975 B2 * 2/2008 Sugiura et al. ............... 310/334
2005/0005421 A1 * 1/2005 Wang et al. ................... 29/594
2006/0169049 A1 * 8/2006 Matsubara .................... 73/754

FOREIGN PATENT DOCUMENTS

| JP | 1-269079 | | 10/1989 |
| JP | 8-500431 | A | 1/1996 |
| JP | 2545713 | B2 | 8/1996 |
| JP | 2002-518913 | A | 6/2002 |
| JP | 2003-163996 | A | 6/2003 |
| WO | WO 93/22669 | A1 | 11/1993 |
| WO | WO 99/65277 | A1 | 12/1999 |

* cited by examiner

*Primary Examiner*—Nitin Parekh
(74) *Attorney, Agent, or Firm*—McDermott Will & Emery LLP

(57) ABSTRACT

A first semiconductor chip includes a fixed electrode formed on a first semiconductor substrate and a plurality of first metal spacers formed on a first interlayer dielectric. A second semiconductor chip includes a vibrating electrode formed on a second semiconductor substrate and a plurality of second metal spacers formed on a second interlayer dielectric. The first and second semiconductor chips are metallically bonded to each other using the first and second metal spacers. An air gap is formed in a region of the condenser microphone located between the first semiconductor chip and the second semiconductor chip except bonded regions of the first and second metal spacers.

4 Claims, 8 Drawing Sheets ved. This makes it difficult to obtain a high-power signal with excellent reliability. Furthermore, the necessity of wiring causes difficulty in coping with a thicknesses reduction demanded of small electronic devices, such as cell phones.

METHOD FOR FABRICATING CONDENSER MICROPHONE AND CONDENSER MICROPHONE

CROSS-REFERENCE TO RELATED APPLICATIONS

The disclosure of Japanese Patent Application No. 2006-092354 filed on Mar. 29, 2006 including specification, drawings and claims is incorporated herein by reference in its entirety.

BACKGROUND OF THE INVENTION (1) Field of the Invention

The present invention relates to methods for fabricating high-reliability condenser microphones, which allow the condenser microphones to be reduced in size, and condenser microphones.

(2) Description of Related Art

Known condenser microphones (acoustic sensors) have been each constructed such that a sound wave detector and a detection circuit are formed on individual substrates and the substrates are packaged with insulating spacer layers interposed therebetween (see, for example, Japanese Unexamined Patent Publication No. 2003-163996).

FIG. 6 is a cross-sectional view illustrating the structure of an electret condenser microphone (ECM) described in Japanese Unexamined Patent Publication No. 2003-163996.

As illustrated in FIG. 6, an ECM 100 includes a composite diaphragm (vibrating electrode) chip 101, a fixed electrode chip 102 and a case 103. Among them, the composite diaphragm chip 101 includes a diaphragm 105, a first metal electrode 108, an electret layer 109, and insulating spacers 110. The fixed electrode chip 102 includes a second metal electrode 117, air holes 115, an air chamber 116, and a MOS field effect transistor (MOSFET) 112. The composite diaphragm chip 101 and the fixed electrode chip 102 are arranged so as to be opposed to each other and packaged by the case 103 with the insulating spacers 110 interposed therebetween. The second metal electrode 117 of the condenser microphone is connected through a wire to the MOSFET 112. A voltage variation associated with a variation in the capacity between a diaphragm electrode and a fixed electrode is detected by the MOSFET 112.

The composite diaphragm chip 101 and the fixed electrode chip 102 are fabricated using individual substrates as illustrated in FIGS. 7A, 7B, and 8A through 8C.

The composite diaphragm chip 101 is fabricated in the following manner. First, as illustrated in FIG. 7A, a diaphragm 105 made of a silicon nitride film is formed on the back surface of a first substrate 104, and an insulating film 106 is formed on the top surface thereof. Thereafter, a recess 107 is formed in the insulating film 106 and the first substrate 104. Then, as illustrated in FIG. 7B, a first metal electrode 108 is formed to cover the insulating film 106 and the recess 107, and an electret layer 109 is formed on the back surface of the diaphragm 105. Thereafter, insulating spacers 110 are formed on the back surfaces of lateral end parts of the electret layer 109.

The fixed electrode chip 102 is fabricated in the following manner. As illustrated in FIG. 8A, a MOSFET 112 is formed on an end part of a second substrate 111. Next, as illustrated in FIG. 8B, insulating films 113 are formed on the top and back surfaces of the second substrate 111, and a plurality of air holes 115 are formed in the top surface of the second substrate 111. Thereafter, as illustrated in FIG. 8C, an air chamber 116 is formed in the back surface of the second substrate 111, and a second metal electrode 117 is formed on the top surface of the second substrate 111.

The composite diaphragm chip 101 and fixed electrode chip 102 so fabricated are arranged so as to be opposed to each other as illustrated in FIG. 6 and packaged by a case 103 with insulating spacers 110 interposed therebetween. In this way, an ECM 100 is completed.

SUMMARY OF THE INVENTION

Since the ECM 100 illustrated in FIG. 6 is fabricated by assembling the composite diaphragm chip 101 and the fixed electrode chip 102, it is suitably reduced in size. However, since the two chips are packaged with the insulating spacers 110 interposed therebetween, the adhesion between the composite diaphragm chip 101 and the fixed electrode chip 102 is poor. This reduces the tolerance of the ECM 100 to vibration.

Since the condenser microphone is connected to the MOSFET 112 by the wire, this produces a parasitic capacitance, resulting in an output signal from the condenser microphone attenuated. This makes it difficult to obtain a high-power signal with excellent reliability. Furthermore, the necessity of wiring causes difficulty in coping with a thicknesses reduction demanded of small electronic devices, such as cell phones.

The present invention is made in view of the above-described problems, and its main object is to provide a small, high-power condenser microphone with excellent reliability.

A method for fabricating a condenser microphone of the present invention is a method for fabricating a condenser microphone including a fixed electrode, a vibrating electrode and an air gap. A first semiconductor chip formed with the fixed electrode is bonded to a second semiconductor chip formed with the vibrating electrode with the air gap interposed between the first semiconductor chip and the second semiconductor chip. The method includes the steps of: forming the fixed electrode on a first semiconductor substrate, then forming a first interlayer dielectric to cover the fixed electrode and the first semiconductor substrate and forming a plurality of metal spacers on the first interlayer dielectric, thereby forming the first semiconductor chip; forming the vibrating electrode on a second semiconductor substrate, then forming a second interlayer dielectric to cover the vibrating electrode and the second semiconductor substrate and forming a plurality of metal spacers on the second interlayer dielectric, thereby forming the second semiconductor chip; and arranging the first and second semiconductor chips so as to be opposed to each other and then metallically bonding the first metal spacers to the associated second metal spacers. The air gap is formed in a region of the condenser microphone located between the first semiconductor chip and the second semiconductor chip except bonded regions of the first and second metal spacers.

According to the above-mentioned method, the first semiconductor chip formed with the fixed electrode is metallically bonded to the second semiconductor chip formed with the vibrating electrode using the metal spacers. Thus, a condenser microphone with excellent vibration resistance and reduced parasitic capacitance can be formed. In this way, a small, high-power condenser microphone can be achieved with excellent reliability.

In one preferred embodiment, the step of forming the first semiconductor chip may further include the step of forming, on the first semiconductor substrate, a detection circuit for detecting a signal from the condenser microphone. Furthermore, the detection circuit preferably includes a MOS transistor, and the fixed electrode is preferably formed simultaneously with a gate electrode of the MOS transistor.

In another preferred embodiment, the step of forming the first semiconductor chip may further include the step of forming a plurality of first contact plugs in the first interlayer dielectric, and the step of forming the second semiconductor chip may further include the steps of forming a plurality of second contact plugs in the second interlayer dielectric and forming a plurality of electrode pads on the second interlayer dielectric, in the step of metallically bonding the first metal spacers to the associated second metal spacers, the fixed electrode may be electrically connected to associated one of the electrode pads through associated one of the first contact plugs, associated one of the first metal spacers, one of the second metal spacers bonded to the associated first metal spacer, and associated one of the second contact plugs.

In still another preferred embodiment, the detection circuit may be electrically connected to associated one of the electrode pads through associated one of the first contact plugs, associated one of the first metal spacers, one of the second metal spacers bonded to the associated first metal spacer, and associated one of the second contact plugs.

The first and second metal spacers are preferably made of a material containing gold or titanium.

In yet another preferred embodiment, it is preferable that the step of forming the second semiconductor chip further includes the step of forming an electret layer on the second semiconductor substrate with the second interlayer dielectric interposed therebetween such that the electret layer and the vibrating electrode overlap one another. The vibrating electrode is preferably made of a silicon film sandwiched between silicon nitride films. The vibrating electrode preferably contains an aluminum material.

In further preferred embodiment, the first semiconductor substrate may be formed with the first semiconductor chip comprising a plurality of first semiconductor chips, the second semiconductor substrate may be formed with the second semiconductor chip comprising a plurality of second semiconductor chips, and in the step of metallically bonding the first metal spacers to the associated second metal spacers, the plurality of first semiconductor chips may be bonded to the plurality of second semiconductor chips at the same time.

A condenser microphone of the present invention includes a fixed electrode, a vibrating electrode and an air gap. A first semiconductor chip formed with the fixed electrode is bonded to a second semiconductor chip formed with the vibrating electrode with the air gap interposed between the first semiconductor chip and the second semiconductor chip. The first semiconductor chip includes the fixed electrode formed on a first semiconductor substrate, a first interlayer dielectric covering the fixed electrode and the first semiconductor substrate, and a plurality of metal spacers formed on the first interlayer dielectric. The second semiconductor chip includes the vibrating electrode formed on a second semiconductor substrate, a second interlayer dielectric covering the vibrating electrode and the second semiconductor substrate, and a plurality of metal spacers formed on the second interlayer dielectric. The first semiconductor chip and the second semiconductor chip are metallically bonded to each other using the first and second metal spacers. The air gap is formed in a region of the condenser microphone located between the first interlayer dielectric and the second interlayer dielectric except bonded regions of the first and second metal spacers.

With this structure, the first semiconductor chip formed with the fixed electrode is metallically bonded to the second semiconductor chip formed with the vibrating electrode using the metal spacers. This enhances the vibration resistance of the condenser microphone and reduces the parasitic capacitance thereof. In this way, a small, high-power condenser microphone can be achieved with excellent reliability.

In one preferred embodiment, the first semiconductor chip may further include a detection circuit formed on the first semiconductor substrate to detect a signal from the condenser microphone.

In another preferred embodiment, the first semiconductor chip may further include a plurality of first contact plugs formed in the first interlayer dielectric, the second semiconductor chip may further include a plurality of second contact plugs formed in the second interlayer dielectric and a plurality of electrode pads formed on the second interlayer dielectric, and the fixed electrode may be electrically connected to associated one of the electrode pads through associated one of the first contact plugs, associated one of the first metal spacers, one of the second metal spacers bonded to the associated first metal spacer, and associated one of the second contact plugs.

In still another preferred embodiment, the detection circuit may be electrically connected to associated one of the electrode pads through associated one of the first contact plugs, associated one of the first metal spacers, one of the second metal spacers bonded to the associated first metal spacer, and associated one of the second contact plugs.

According to the condenser microphone of the present invention and the fabrication method for the same, the first semiconductor chip formed with the fixed electrode is metallically bonded to the second semiconductor chip formed with the vibrating electrode using the metal spacers. This enhances the vibration resistance of the condenser microphone and reduces the parasitic capacitance thereof. In this way, a small, high-power condenser microphone can be achieved with excellent reliability.

DETAILED DESCRIPTION OF THE INVENTION

Figure 1:
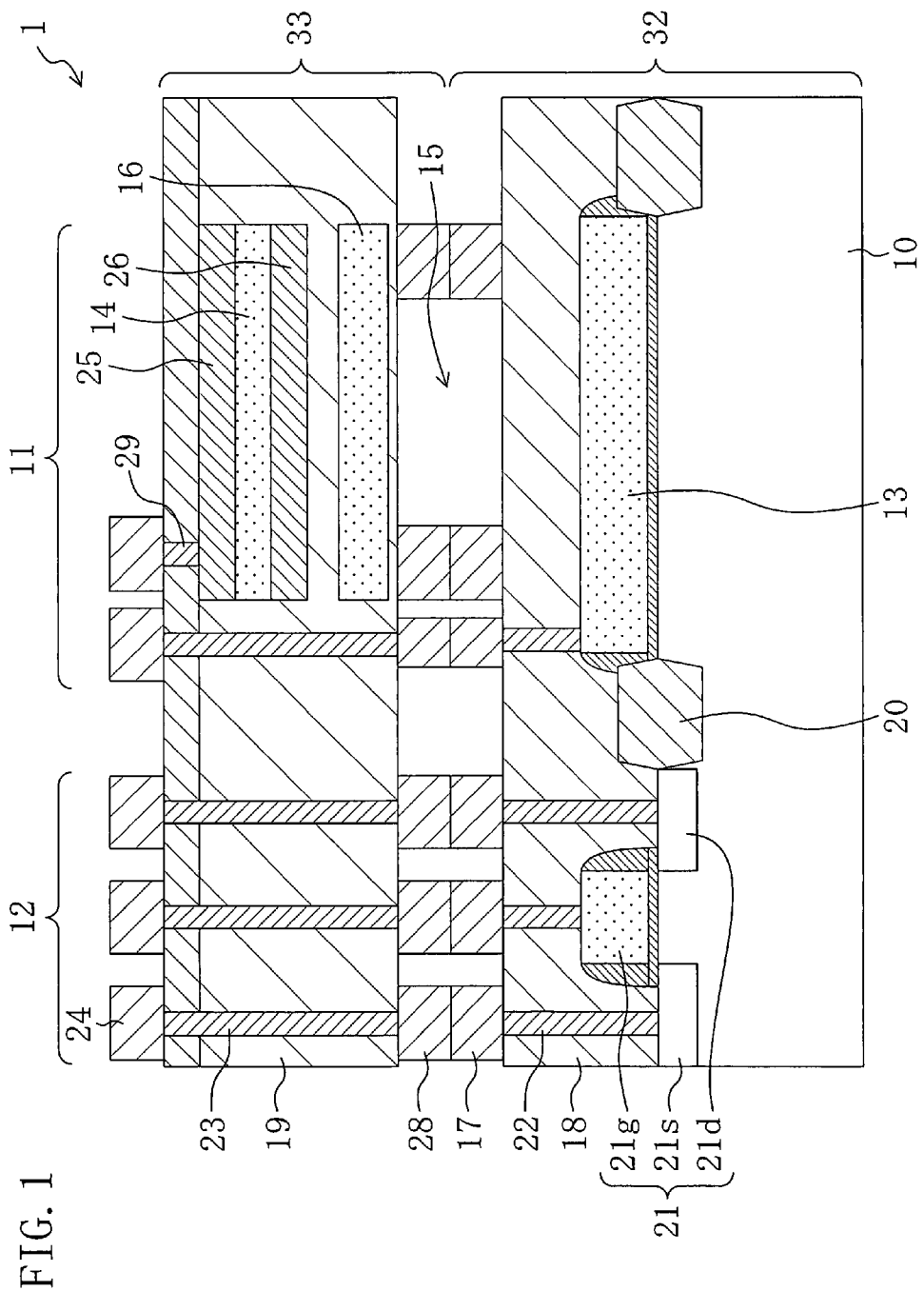
FIGS. 1 and 2 are cross-sectional views schematically illustrating the structure of an electret condenser microphone according to an embodiment of the present invention.

An embodiment of the present invention will be described hereinafter with reference to the drawings. For simplicity, components having substantially the same function are represented by the same reference numerals. The present invention is not limited to the embodiment described below.

FIG. 1 is a cross-sectional view schematically illustrating the structure of an electret condenser microphone (acoustic sensor) 1 according to this embodiment. The condenser microphone 1 of this embodiment includes a condenser region 11 and a detection circuit region 12 which are connected through a wire (unshown) to each other.

As illustrated in FIG. 1, the condenser microphone 1 includes a lower electrode (fixed electrode) 13, an upper electrode (vibrating electrode) 14 and an air gap 15 and is configured such that a first semiconductor chip 32 formed with the lower electrode 13 and a second semiconductor chip 33 formed with the upper electrode 14 are opposed to each other with the air gap 15 interposed therebetween.

The first semiconductor chip 32 includes the lower electrode 13 formed on a first semiconductor substrate 10, a first interlayer dielectric 18 covering the first semiconductor substrate 10 and the lower electrode 13, and a plurality of metal spacers 17 formed on the first interlayer dielectric 18. The second semiconductor chip 33 includes the upper electrode 14 formed on a second semiconductor substrate (unshown), a second interlayer dielectric 19 covering the second semiconductor substrate and the upper electrode 14, and a plurality of second metal spacers 28 formed on the second interlayer dielectric 19.

The first and second semiconductor chips 32 and 33 are metallically bonded to each other using the first and second metal spacers 17 and 18. The air gap 15 is formed in a part of the condenser region 11 located between the first and second interlayer dielectrics 18 and 19 except regions thereof where the first metal spacers 17 are bonded to the second metal spacers 28 (hereinafter, referred to as "bonded regions of the first and second metal spacers 17 and 28).

The structure of the condenser microphone 1 of this embodiment will be described hereinafter in detail with reference to FIG. 1.

A source region 21s and a drain region 21d of a MOS transistor 21 is formed in the top surface of a part of a silicon substrate (first semiconductor substrate) 10 located in a detection circuit region 12 of the condenser microphone 1. A gate electrode 21g is formed on a part of the silicon substrate 10 located in the detection circuit region 12 with a gate insulating film interposed therebetween. The gate insulating film is an approximately 10-nm-thick silicon oxide film. An isolation region 20 is formed to surround the transistor 21. Instead of the MOS transistor 21, a bipolar transistor may be used as a circuit element forming part of the detection circuit region 12.

On the other hand, a lower electrode 13 is formed on a part of the silicon substrate 10 located in a condenser region 11 of the condenser microphone 1 with a gate insulating film interposed therebetween. The lower electrode 13 is formed simultaneously with the gate electrode 21g, thereby simplifying a fabrication process for a condenser microphone. A silicon oxide film (first interlayer dielectric) 18 is formed on the silicon substrate 10 to cover the transistor 21 and the lower electrode 13.

An approximately 1-μm-deep air gap 15 is formed on a part of the silicon oxide film 18 located on the lower electrode 13. A silicon oxide film (second interlayer dielectric) 19 and an electret layer 16 are formed on the air gap 15. Furthermore, an upper electrode 14 is formed over the electret layer 16 with part of the silicon oxide film 19 interposed therebetween and sandwiched between silicon nitride films 25 and 26. The upper electrode 14 serving as a vibrating electrode is made of polysilicon and has a thickness of approximately 500 nm. The silicon nitride films 25 and 26 possess high tensile strength and thus are compatible with silicon processes. Therefore, they can prevent the vibrating film from being suspended after the formation of the air gap 15. When a soft aluminum material is used instead of polysilicon, this increases the amplitude of the upper electrode 14 due to a sound wave. As a result, a high-power signal can be provided. When an aluminum material is used for the upper electrode 14, the silicon nitride film 26 is not formed.

A plurality of first and second metal spacers 17 and 28 made of an alloyed titanium material are formed between the upper electrode 14 and the lower electrode 13 with the silicon oxide film 18 interposed between the first metal spacers 17 and the lower electrode 13 and the silicon oxide film 19 interposed between the second metal spacers 28 and the upper electrode 14. The first metal spacers 17 are metallically bonded to the associated second metal spacers 28, thereby fixing a first semiconductor chip 32 formed with the lower electrode 13 and the transistor 21 and a second semiconductor chip 33 formed with the upper electrode 14. Simultaneously, the first semiconductor chip 32 and the second semiconductor chip 33 are supported by the first and second metal spacers 17 and 28, thereby forming an air gap 15 in a part of the condenser region 11 between the first and second semiconductor chips 32 and 33. In this way, a high-capacity capacitor microphone having a several-μm-deep air gap can be formed, thereby achieving a small condenser microphone (acoustic sensor).

A plurality of first contact plugs 22 are formed in the silicon oxide film (first interlayer dielectric) 18. Furthermore, a plurality of second contact plugs 23 are formed in the silicon oxide film (second interlayer dielectric) 19. Moreover, a plurality of electrode pads 24 are formed on the silicon oxide film 19.

The lower electrode 13 is electrically connected to associated one of the electrode pads 24 through associated one of the first contact plugs 22, associated one of the first metal spacers 17, one of the second metal spacers 28 which is bonded to the associated first metal spacer 17, and associated one of the second contact plugs 23. Likewise, the detection circuit (the source and drain regions 21s and 21d and the gate electrode 21g) is also electrically connected to associated ones of the second electrode pads 24 through associated ones of the first contact plugs 22, associated ones of the first metal spacers 17, ones of the second metal spacers 28 which are bonded to the associated first metal spacers 17, and associated ones of the second contact plugs 23. In this way, the potentials of all of the lower electrode 13, the upper electrode 14 and the detection circuit of the condenser can be extracted from one surface of the condenser microphone (the top surface of the silicon oxide film 19).

When the lower electrode 13 (or the upper electrode 14) is connected to the gate electrode 21g of the transistor, a voltage variation associated with a variation in the capacity between the upper electrode 14 and the lower electrode 13 is delivered to an output terminal of the transistor.

Figure 2:
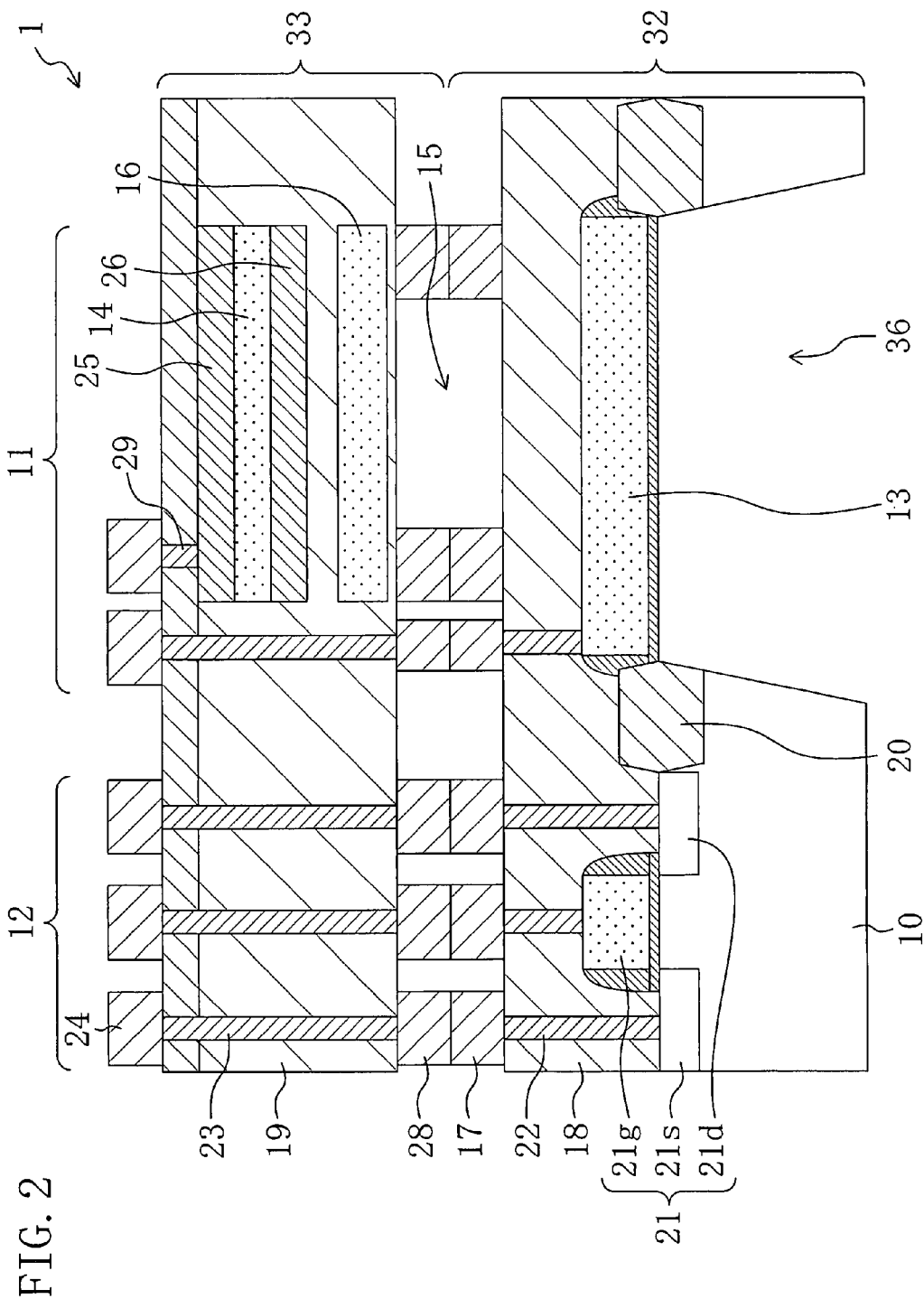

In a case where the lower electrode 13 and the gate electrode 21g of the transistor are electrically connected to each other to produce an output, the parasitic capacitance produced between the silicon substrate 10 and the lower electrode 13 is larger than the capacitance produced between the upper electrode 14 and the lower electrode 13. Therefore, it is less likely to detect a capacitance variation caused by vibration of the upper electrode 13. In view of the above, as illustrated in FIG. 2, an air chamber 36 is preferably formed by removing a part of the silicon substrate 10 located under the lower electrode 13.

On the other hand, in a case where the upper electrode 14 and the gate electrode 21g of the transistor are electrically connected to each other to produce an output, the part of the silicon substrate 10 located under the lower electrode 13 does not have to be removed.

Next, a fabrication method for a condenser microphone (acoustic sensor) 1 according to this embodiment will be described with reference to the cross-sectional views illustrated in FIGS. 3A through 5B.

Figure 3A:
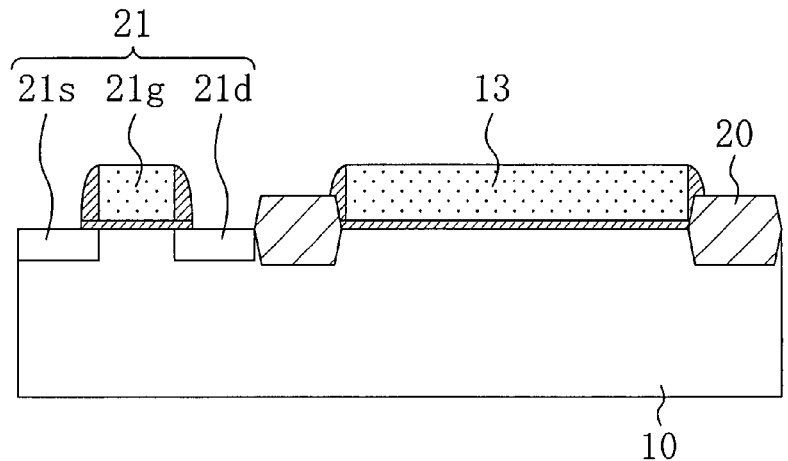
FIGS. 3A through 5B are cross-sectional views illustrating process steps in a method for fabricating a condenser microphone according to the embodiment of the present invention.

First, as illustrated in FIG. 3A, an isolation region 20 is formed in a silicon substrate (first semiconductor substrate) 10 by selectively forming a silicon oxide film therein using chemical vapor deposition (CVD). Subsequently, a gate insulating film and a polysilicon film are deposited on the silicon substrate 10 and then subjected to dry etching, thereby selectively forming a gate electrode 21g and a lower electrode (fixed electrode) 13 both made of the polysilicon film. Subsequently, a source region 21s and a drain region 21d are formed in the silicon substrate 10 by ion implantation using the gate electrode 21g (if necessary, the gate electrode 21g and sidewalls formed on the lateral sides of the gate electrode 21g) as a mask.

Figure 3B:
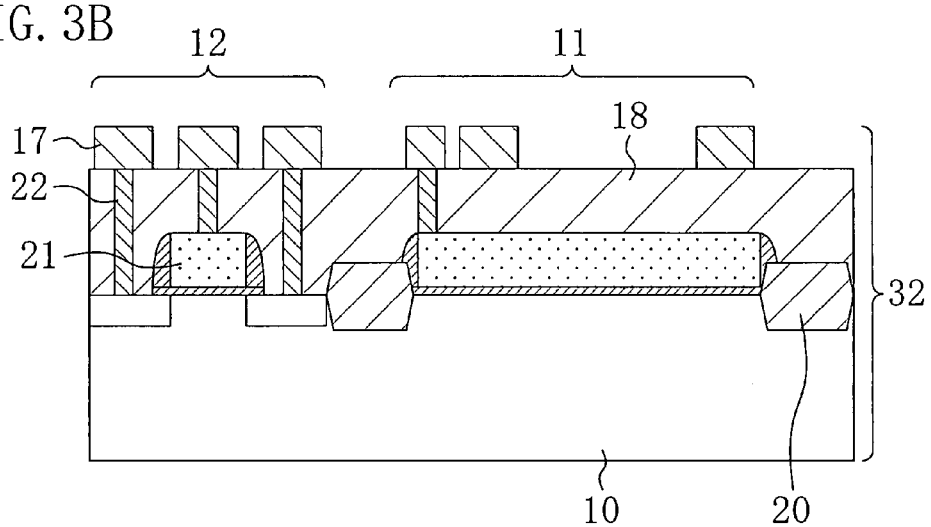

Next, as illustrated in FIG. 3B, a silicon oxide film (first interlayer dielectric) 18 is entirely deposited on the silicon substrate 10, and the deposited silicon oxide film 18 is planarized by dry etching and chemical mechanical polishing (CMP). Thereafter, contact holes are formed in the silicon oxide film 18 and then filled with a conductor, such as tungsten, thereby forming first contact plugs 22. Subsequently, titanium is deposited on the silicon oxide film 18 by sputtering, and further gold that is a material for bonding one chip with another chip is deposited on the titanium by electron beam (EB) evaporation. The deposited titanium and gold are patterned, thereby forming a plurality of first metal spacers 17. Titanium offers excellent adhesion with the silicon oxide film 18 and serves to prevent the first metal spacers 17 from separating from the silicon oxide film 18 due to vibration or the like. In this way, a first semiconductor chip 32 is formed on the first semiconductor substrate 10 to have the fixed electrode 13 forming a part of a condenser region 11 of a condenser microphone and a part of a detection circuit region 12 thereof.

The titanium and the gold typically have thicknesses of approximately 10 through 100 nm and approximately 200 through 600 nm, respectively. Not only gold, but also aluminum, a layered structure of titanium and aluminum, titanium alone, or a gold/tin eutectic material can be a material for bonding one chip to another chip.

Figure 3C:
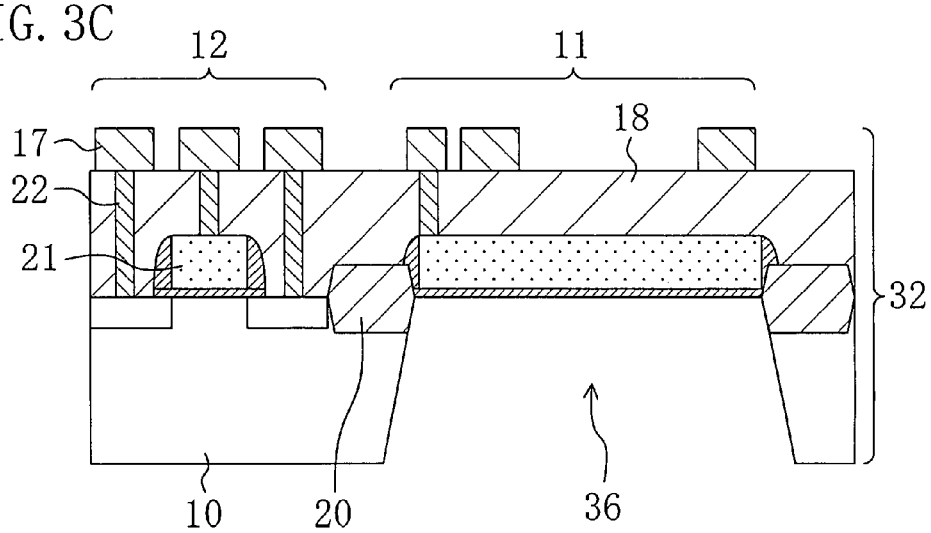

In a case where an air chamber 36 is formed under the lower electrode 13, the air chamber 36 is formed, as illustrated in FIG. 3C, in the following manner. A resist film is formed on the back surface of the silicon substrate 10 and then patterned. Thereafter, the silicon substrate 10 is subjected to wet etching using a potassium hydroxide solution having a selectivity to a silicon oxide film serving as a material of the gate insulating film located under the lower electrode 13, and a part of the silicon substrate 10 located under the lower electrode 13 is removed. Dry etching may be used instead of wet etching.

Figure 4A:
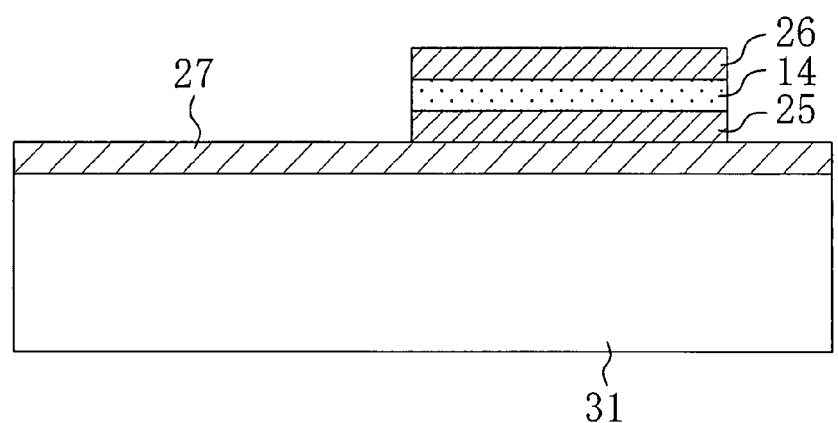

Next, as illustrated in FIG. 4A, a silicon oxide film (second interlayer dielectric) 27 is formed on another silicon substrate (second semiconductor substrate) 31 by CVD. Subsequently, a silicon nitride film 25, an upper electrode 14 and a silicon nitride film 26 are sequentially deposited on the silicon oxide film 27 and then subjected to dry etching, thereby selectively forming a vibrating electrode. In this case, the upper electrode 14 is formed of polysilicon. However, when an aluminum material is used for the upper electrode 14, the upper electrode 14 will be soft. This significantly facilitates bending the upper electrode 14 due to a sound wave. Therefore, the amount of capacity variation is increased, thereby providing a high power. When aluminum is used for the upper electrode 14, the silicon nitride film 26 is not formed. The reason for this is that a silicon nitride film is formed by a low-pressure CVD at a temperature of 500° C. or more and thus aluminum will dissolve.

Figure 4B:
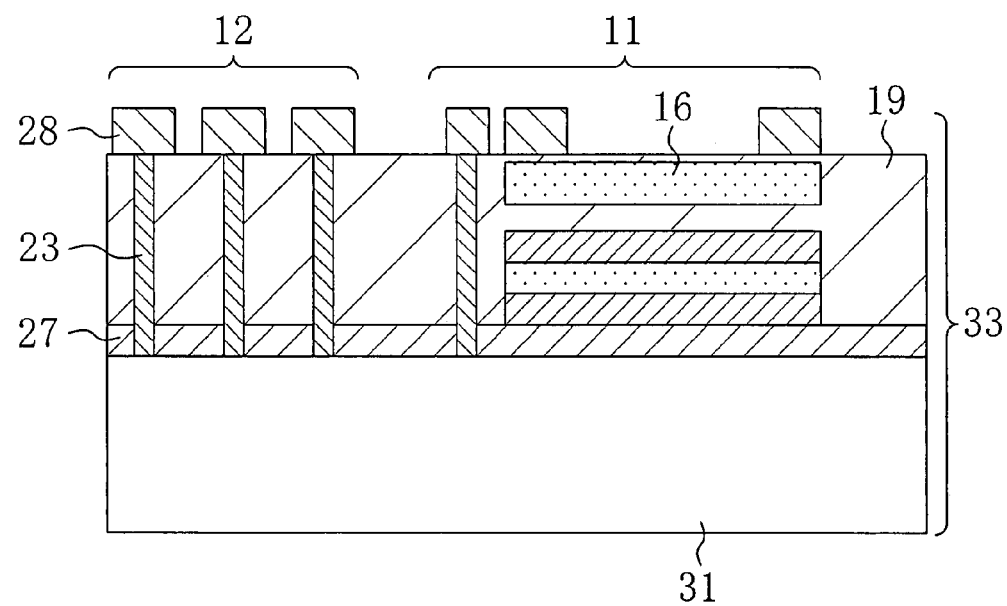

Next, as illustrated in FIG. 4B, a silicon oxide film (second interlayer dielectric) 19 is entirely deposited on the silicon substrate 31, and its surface is planarized by CMP. Subsequently, contact holes are formed in the silicon oxide film 19 and filled with a conductor, such as tungsten, thereby forming second contact plugs 23. Thereafter, an approximately 0.1-µm-through 1-µm-deep recess is formed in part of the silicon oxide film 19, and a charge retention material is buried in this recess, thereby forming an electret layer 16. This burying process is carried out by an etch-back process after the deposition of the charge retention material on the entire surface of the silicon oxide film 19 by sputtering. A silicon oxide film having a long charge retention time is used as the charge retention material. When a benzocyclobutene (BCB) material or a fluorine-based polymeric material is used as the charge retention material, the charge retention material can be formed also by spin coating. In this case, a silicon oxide film is preferably formed on the electret layer 16.

Subsequently, titanium is deposited on the silicon oxide film 19 to a thickness of 10 through 100 nm by sputtering, and further gold is deposited on the titanium to a thickness of 200 through 600 nm by EB evaporation. Thereafter, the deposited titanium and gold are subjected to dry etching, thereby selectively forming a plurality of second metal spacers 28. When a BCB material or a fluorine-based polymeric material is used as a material of the electret layer 16, the second metal spacers 28 may be formed directly on the electret layer 16. In this way, a second semiconductor chip 33 is formed on the second semiconductor substrate 31 to have the vibrating electrode 14 forming a part of the condenser region 11.

Charges are accumulated in the electret layer 16 as follows. The silicon substrate 31 is heated to a temperature of approximately 100° C., and thus charges accumulated in the top surface of the silicon substrate 31 are removed. Thereafter, charges are accumulated in the charge retention material by corona discharge, and the silicon substrate 31 is heated again to a temperature of approximately 100° C., thereby removing charges accumulated in other parts of the second semiconductor chip 33 than the charge retention material.

Figure 5A:
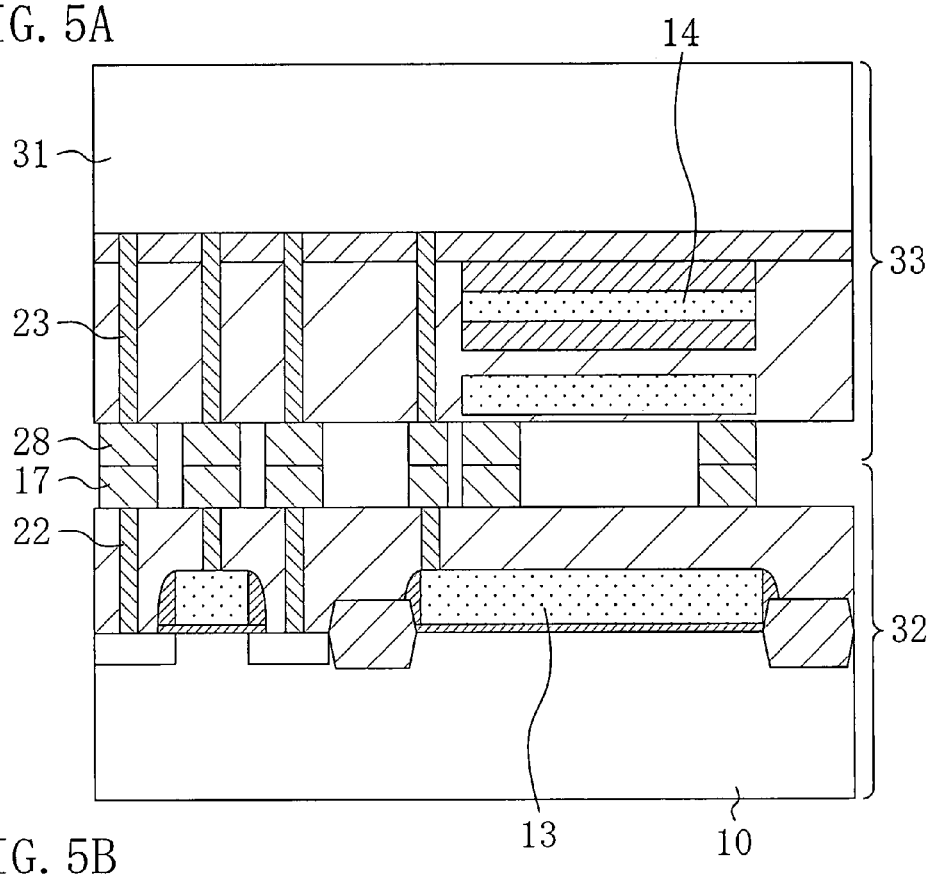

Next, as illustrated in FIG. 5A, the first semiconductor chip 32 and the second semiconductor chip 33 are arranged so as to be opposed to each other, and then the first metal spacers 17 are metallically bonded to the associated second metal spacers 28. This bonding is carried out as follows: The first metal spacers 17 are brought into contact with the associated second metal spacers 28 in an atmosphere in which a vacuum with a pressure of several Torr is heated to a temperature of approximately 150 through 300° C., and a pressure of 600 N is applied to the first and second metal spacers 17 and 28 for approximately 15 and 20 minutes. After this bonding, the temperature of the atmosphere is reduced to a room temperature by self cooling. The area where the first metal spacers 17 are bonded to the second metal spacers 28 is typically approximately 15 through 30% of the chip area.

Figure 5B:
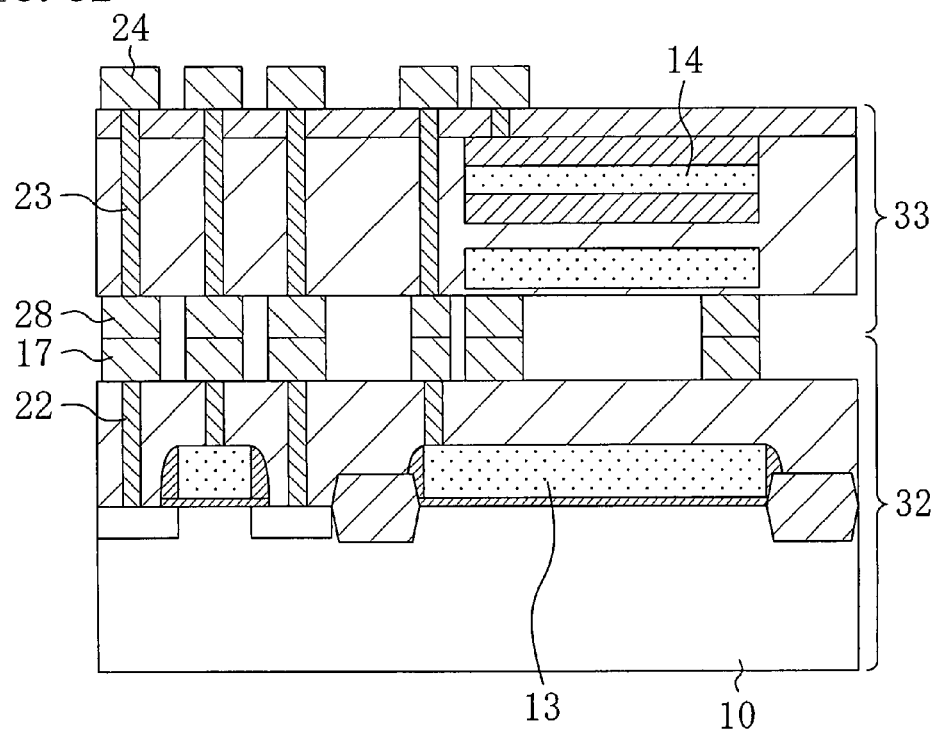
Figure 6:
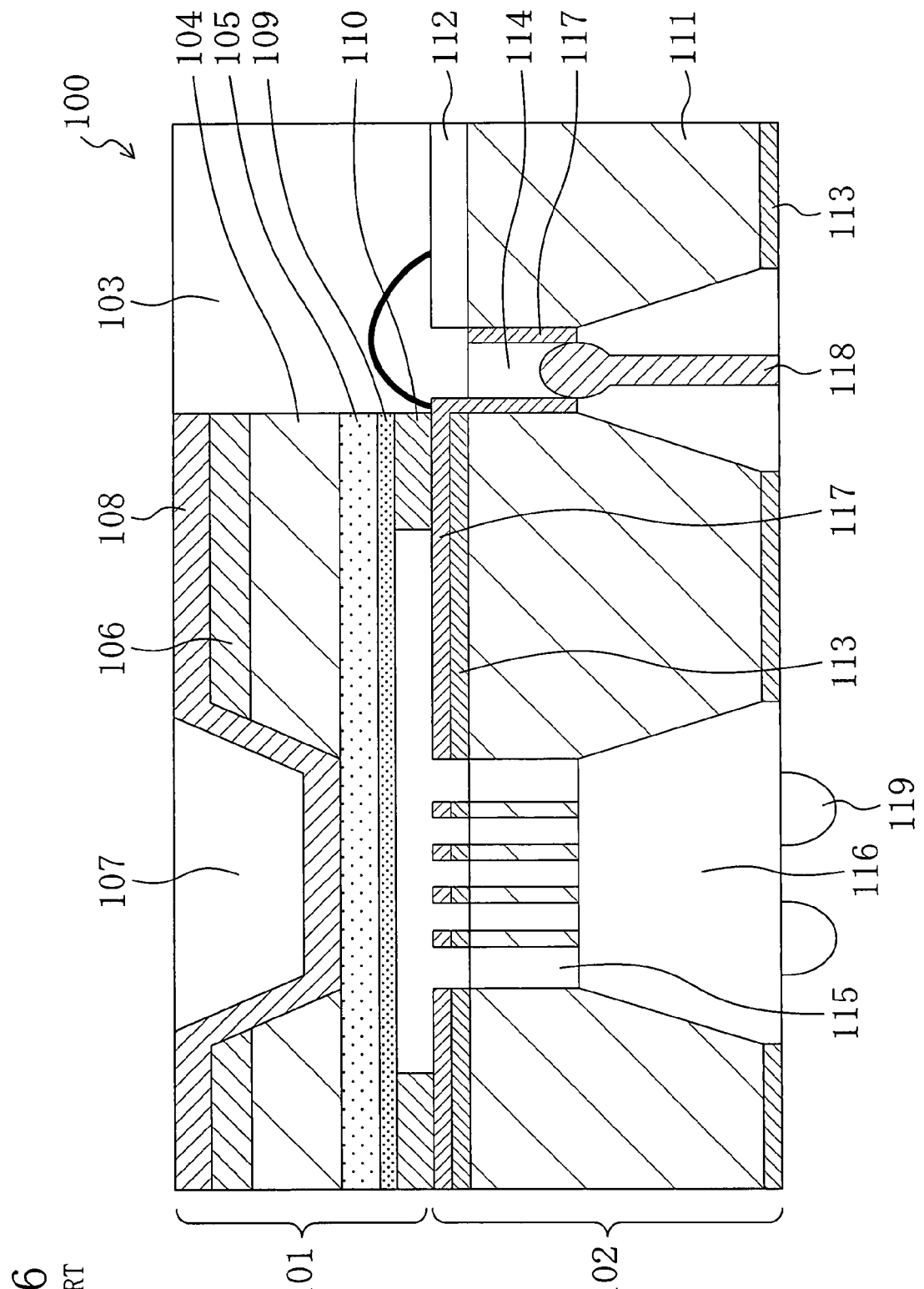
FIG. 6 is a cross-sectional view illustrating the structure of a known condenser microphone.
Figure 7A:
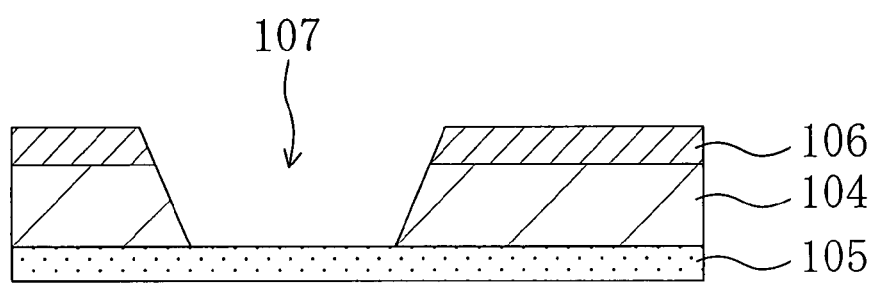
FIGS. 7A through 8C are cross-sectional views illustrating process steps in a known method for fabricating a condenser microphone.
Figure 7B:
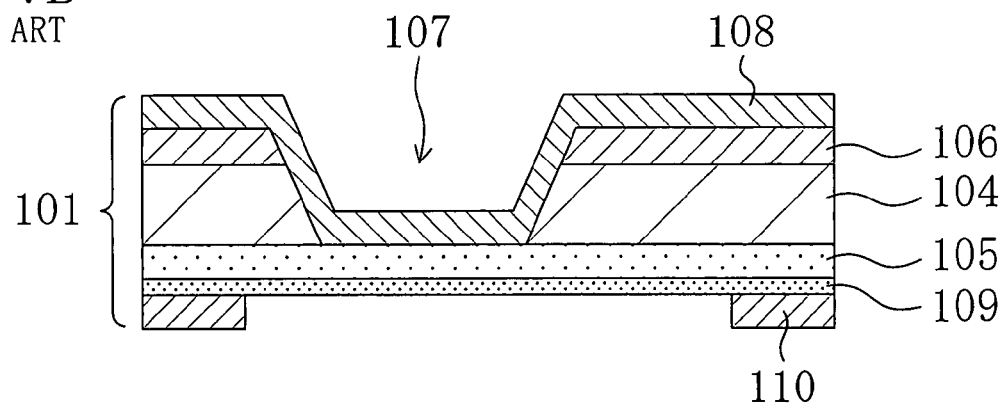
Figure 8A:
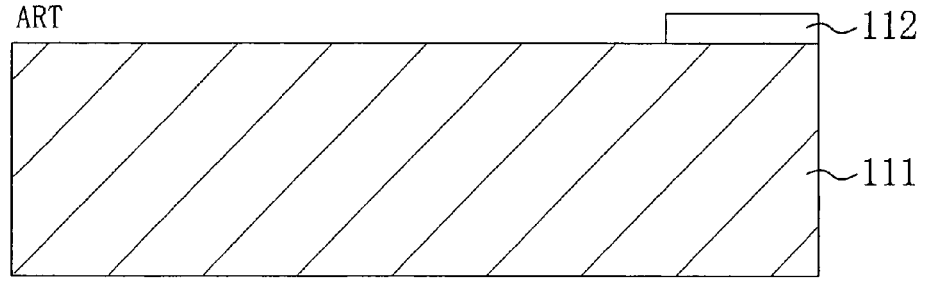
Figure 8B:
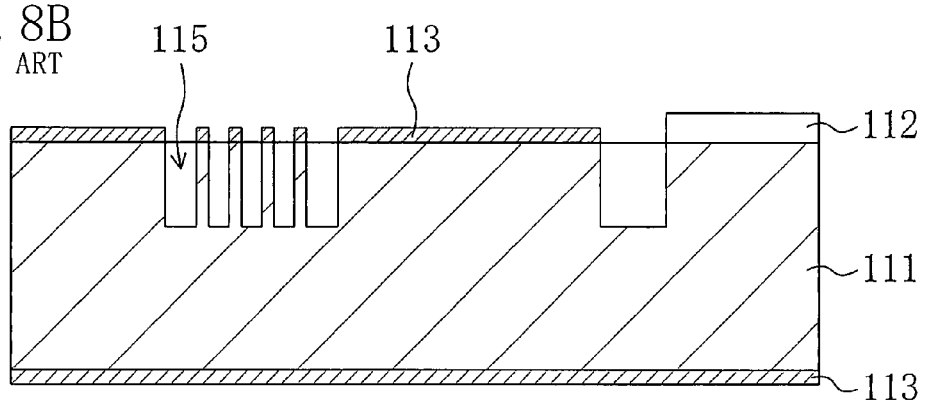
Figure 8C:
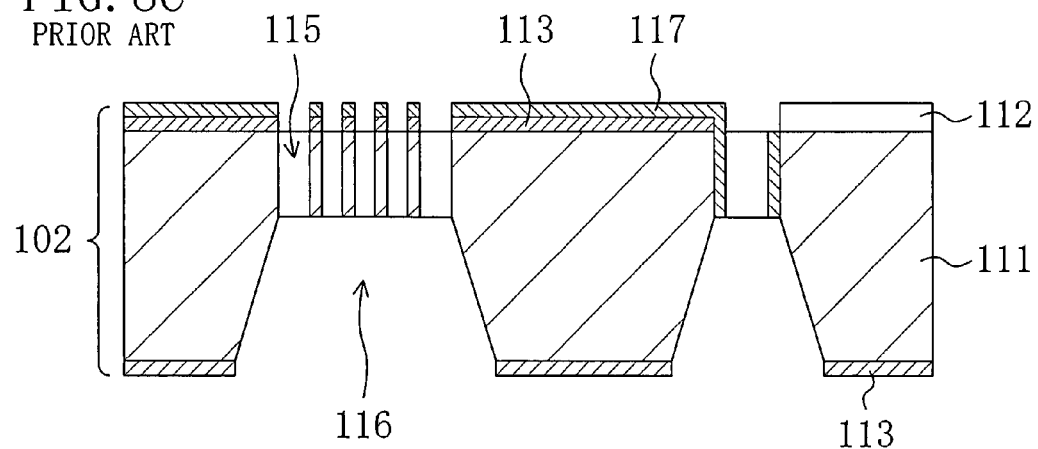

Finally, as illustrated in FIG. 5B, the back surface of the silicon substrate 10 is coated with wax or a resist (unshown), and then the silicon substrate 31 is removed by etching using a gas of chlorine trifluoride. Thereafter, an aluminum film is formed on the silicon oxide film 27 by sputtering and then subjected to dry etching, thereby selectively forming a plurality of electrode pads 24. In this way, a condenser microphone is completed.

The area of patterns of the first or second metal spacers 17 or 28 when seen from above secures approximately 20 through 50% of the chip area. A pair of one of the first metal spacers 17 and associated one of the second metal spacers 28 is formed in outer end parts of the condenser region 11. The air gap 15 of the condenser can be changed in depth according to the thickness of the pair of first and second metal spacers 17 and 28 and typically has a depth of approximately 1 µm. In view of the above, a high-capacity capacitor can be formed, thereby providing a high-power signal.

As illustrated in FIG. 3C, a part of the silicon substrate 10 located under the lower electrode 13 is removed before the metallic bonding. Alternatively, after the metallic bonding illustrated in FIG. 5B, the part of the silicon substrate 10 located under the lower electrode 13 may be removed using the similar method.

As described above, the condenser microphone (acoustic sensor) of the present invention can be enhanced in its vibration resistance and further reduced in its parasitic capacitance by metallically bonding a first semiconductor chip formed with a fixed electrode to a second semiconductor chip formed with a vibrating electrode through metal spacers. In this way, a small, high-power condenser microphone can be achieved with excellent reliability.

When the condenser has a hollow capacitor structure having an electret layer made of a charge retention material, this eliminates the need for a charge supply circuit for supplying charges to the condenser. Thus, a condenser microphone can be reduced in size and cost. Furthermore, an air gap of a capacitor can be easily changed in its depth by changing the thickness of a pair of metal spacers, thereby achieving a high-capacity condenser.

While the present invention was described above with reference to the preferred embodiment, the above description is not limited and can be certainly modified in various ways. For example, a plurality of first semiconductor chips 32 and a plurality of second semiconductor chips 33 may be formed on the first and second semiconductor substrates 10 and 31, respectively. In this case, the first metal spacers are metallically bonded to the second metal spacers, thereby bonding the plurality of first semiconductor chips 32 to the plurality of second semiconductor chips 33 at the same time. This allows a plurality of condenser microphones to be fabricated at the same time, resulting in significantly increased productivity.

What is claimed is:

1. A condenser microphone including a fixed electrode, a vibrating electrode and an air gap, a first semiconductor chip formed with the fixed electrode being bonded to a second semiconductor chip formed with the vibrating electrode with the air gap interposed between the first semiconductor chip and the second semiconductor chip, the first semiconductor chip comprising the fixed electrode formed on a first semiconductor substrate, a first interlayer dielectric covering the fixed electrode and the first semiconductor substrate, and a plurality of first metal spacers formed on the first interlayer dielectric, the second semiconductor chip comprising the vibrating electrode formed on a second semiconductor substrate, a second interlayer dielectric covering the vibrating electrode and the second semiconductor substrate, and a plurality of second metal spacers formed on the second interlayer dielectric, the first semiconductor chip and the second semiconductor chip being metallically bonded to each other using the first and second metal spacers, and the air gap being formed in a region of the condenser microphone located between the first interlayer dielectric and the second interlayer dielectric except bonded regions of the first and second metal spacers.

2. The condenser microphone of claim 1, wherein
the first semiconductor chip further includes a detection circuit formed on the first semiconductor substrate to detect a signal from the condenser microphone.

3. The condenser microphone of any one of claims 1 and 2, wherein
the first semiconductor chip further includes a plurality of first contact plugs formed in the first interlayer dielectric,
the second semiconductor chip further includes a plurality of second contact plugs formed in the second interlayer dielectric and a plurality of electrode pads formed on the second interlayer dielectric, and
the fixed electrode is electrically connected to associated one of the electrode pads through associated one of the first contact plugs, associated one of the first metal spacers, one of the second metal spacers bonded to the associated first metal spacer, and associated one of the second contact plugs.

4. The condenser microphone of claim 3, wherein
the detection circuit is electrically connected to associated one of the electrode pads through associated one of the first contact plugs, associated one of the first metal spacers, one of the second metal spacers bonded to the associated first metal spacer, and associated one of the second contact plugs.

* * * * *